(12) United States Patent
Lee

(10) Patent No.: US 9,224,831 B2
(45) Date of Patent: Dec. 29, 2015

(54) METHOD OF MANUFACTURING AN OXIDE SEMICONDUCTOR DEVICE AND METHOD OF MANUFACTURING A DISPLAY DEVICE HAVING THE SAME

(71) Applicant: Samsung Display Co., Ltd., Yongin (KR)

(72) Inventor: Bong-Won Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 85 days.

(21) Appl. No.: 14/140,944

(22) Filed: Dec. 26, 2013

(65) Prior Publication Data

US 2015/0024530 A1     Jan. 22, 2015

(30) Foreign Application Priority Data

Jul. 18, 2013    (KR) .................. 10-2013-0084478

(51) Int. Cl.
| | |
|---|---|
| H01L 21/336 | (2006.01) |
| H01L 21/84 | (2006.01) |
| H01L 29/66 | (2006.01) |
| H01L 29/786 | (2006.01) |
| H01L 27/12 | (2006.01) |

(52) U.S. Cl.
CPC ...... *H01L 29/66477* (2013.01); *H01L 27/1288* (2013.01); *H01L 29/66765* (2013.01); *H01L 29/66969* (2013.01); *H01L 29/7869* (2013.01); *H01L 29/78618* (2013.01)

(58) Field of Classification Search
CPC .............. H01L 29/66765; H01L 29/78618; H01L 29/7869; H01L 27/1288

USPC ........................................... 438/158
See application file for complete search history.

(56) References Cited

U.S. PATENT DOCUMENTS

| | | | | |
|---|---|---|---|---|
| 4,945,067 A | * | 7/1990 | Huang | 438/157 |
| 5,166,085 A | * | 11/1992 | Wakai et al. | 438/158 |
| 5,173,753 A | * | 12/1992 | Wu | 257/347 |
| 5,407,845 A | * | 4/1995 | Nasu et al. | 438/30 |
| 5,650,358 A | * | 7/1997 | Gu et al. | 438/30 |
| 5,658,806 A | * | 8/1997 | Lin et al. | 438/157 |
| 5,923,963 A | * | 7/1999 | Yamanaka | 438/157 |

(Continued)

FOREIGN PATENT DOCUMENTS

| | | |
|---|---|---|
| JP | 07-183311 | 7/1995 |
| KR | 10-0516747 | 10/2005 |
| KR | 10-0915070 | 9/2009 |

*Primary Examiner* — Mary Wilczewski
(74) *Attorney, Agent, or Firm* — H.C. Park & Associates, PLC

(57) ABSTRACT

Disclosed is a method of manufacturing an oxide semiconductor device, including: forming a gate electrode on a substrate; forming a gate insulating layer on the gate electrode; forming an active pattern on the gate insulating layer; forming a first mask pattern on the gate insulating layer and the active pattern; forming an insulating interlayer on the gate insulating layer, the active pattern, and the first mask pattern; forming a second mask pattern on the insulating interlayer, the second mask pattern comprising an opening that exposes a region where the first mask pattern is formed; forming contact holes exposing portions of the active pattern by patterning the insulating interlayer using the first mask pattern and the second mask pattern; and forming a source electrode and a drain electrode on the gate insulating layer by filling the contact holes, the drain electrode spaced apart from the source electrode.

18 Claims, 13 Drawing Sheets

(56) References Cited

U.S. PATENT DOCUMENTS

| | | | | |
|---|---|---|---|---|
| 5,998,230 A * | 12/1999 | Gee-Sung et al. | | 438/30 |
| 6,043,512 A * | 3/2000 | Adachi | | 257/66 |
| 6,103,557 A * | 8/2000 | Nakanishi | | 438/158 |
| 6,232,158 B1 * | 5/2001 | Lee | | 438/160 |
| 6,245,602 B1 * | 6/2001 | Ho et al. | | 438/158 |
| 6,335,232 B1 * | 1/2002 | Ohori et al. | | 438/158 |
| 7,767,505 B2 * | 8/2010 | Son et al. | | 438/158 |
| 7,915,075 B2 * | 3/2011 | Suzawa et al. | | 438/104 |
| 7,993,991 B2 * | 8/2011 | Miyairi et al. | | 438/151 |
| 7,998,801 B2 * | 8/2011 | Sasagawa et al. | | 438/158 |
| 8,299,529 B2 * | 10/2012 | Takasawa et al. | | 257/350 |
| 8,338,827 B2 * | 12/2012 | Yamazaki et al. | | 257/43 |
| 8,389,344 B2 * | 3/2013 | Jung et al. | | 438/151 |
| 8,450,733 B2 * | 5/2013 | Wang et al. | | 257/43 |
| 8,624,237 B2 * | 1/2014 | Yamazaki et al. | | 257/43 |
| 8,723,174 B2 * | 5/2014 | Nakazawa | | 257/43 |
| 8,912,538 B2 * | 12/2014 | Liu et al. | | 257/43 |
| 2007/0269937 A1 * | 11/2007 | Lin | | 438/149 |
| 2008/0090341 A1 * | 4/2008 | Tanaka et al. | | 438/158 |
| 2009/0146150 A1 * | 6/2009 | Hosoya | | 257/59 |
| 2009/0166636 A1 * | 7/2009 | Park et al. | | 257/67 |
| 2009/0189160 A1 * | 7/2009 | Ahn et al. | | 257/66 |
| 2009/0212288 A1 * | 8/2009 | Kim et al. | | 257/57 |
| 2009/0256469 A1 * | 10/2009 | Park et al. | | 313/504 |
| 2009/0289258 A1 * | 11/2009 | Kim et al. | | 257/66 |
| 2009/0305473 A1 * | 12/2009 | Luo et al. | | 438/158 |
| 2009/0315034 A1 * | 12/2009 | Lee et al. | | 257/66 |
| 2010/0025678 A1 * | 2/2010 | Yamazaki et al. | | 257/43 |
| 2010/0025679 A1 * | 2/2010 | Yamazaki et al. | | 257/43 |
| 2010/0032667 A1 * | 2/2010 | Yamazaki et al. | | 257/43 |
| 2010/0032681 A1 * | 2/2010 | Kuriyagawa et al. | | 257/72 |
| 2010/0047974 A1 * | 2/2010 | Lim et al. | | 438/158 |
| 2010/0051949 A1 * | 3/2010 | Yamazaki et al. | | 257/57 |
| 2010/0062556 A1 * | 3/2010 | Sasagawa et al. | | 438/34 |
| 2010/0096638 A1 * | 4/2010 | Choo et al. | | 257/72 |
| 2010/0099216 A1 * | 4/2010 | Suzawa et al. | | 438/104 |
| 2010/0155733 A1 * | 6/2010 | Moon et al. | | 257/59 |
| 2015/0024530 A1 * | 1/2015 | Lee | | 438/34 |

* cited by examiner

METHOD OF MANUFACTURING AN OXIDE SEMICONDUCTOR DEVICE AND METHOD OF MANUFACTURING A DISPLAY DEVICE HAVING THE SAME

CROSS-REFERENCE TO RELATED APPLICATION(S)

This application claims the benefit of and priority from Korean Patent Application No. 10-2013-0084478, filed on Jul. 18, 2013, which is hereby incorporated by reference for all purposes as if fully set forth herein.

BACKGROUND

1. Field

Exemplary embodiments of the present disclosure relate to a method of manufacturing an oxide semiconductor device, and a method of manufacturing a display device having an oxide semiconductor device.

2. Discussion of the Background

In a conventional transistor, its active pattern may include a semiconductor material such as amorphous silicon or polysilicon. When the active pattern includes amorphous silicon, the transistor may have a relatively low mobility, and thus a display device including a conventional transistor with amorphous silicon may not operate at high speed. Alternatively, when the active pattern includes polysilicon, the transistor can have a relatively high mobility. However, the transistor may have a non-uniform threshold voltage, and thus a conventional transistor with polysilicon may have a disadvantage that an additional circuit such as a compensating circuit is used.

For this reason, oxide semiconductor thin film transistors, of which the active pattern includes an oxide semiconductor, have been researched on and developed. However, when an oxide semiconductor is employed in a transistor having a bottom-gate structure, the active pattern (i.e., the oxide semiconductor) may be damaged while subsequently forming the source electrode and the drain electrode.

SUMMARY

Various exemplary embodiments of the present disclosure provide a method of manufacturing an oxide semiconductor device capable of preventing damages of an active pattern.

Various exemplary embodiments of the present disclosure provide a method of manufacturing a display device having the oxide semiconductor device capable of preventing damages of an active pattern.

One exemplary embodiment provides a method of manufacturing an oxide semiconductor device, including: forming a gate electrode on a substrate; forming a gate insulating layer on the gate electrode; forming an active pattern on the gate insulating layer; forming a first mask pattern on the gate insulating layer and the active pattern; forming an insulating interlayer on the gate insulating layer, the active pattern, and the first mask pattern; forming a second mask pattern on the insulating interlayer, the second mask pattern comprising an opening that exposes a region where the first mask pattern is formed; forming contact holes exposing portions of the active pattern by patterning the insulating interlayer using the first mask pattern and the second mask pattern; and forming a source electrode and a drain electrode on the gate insulating layer by filling the contact holes, the drain electrode spaced apart from the source electrode.

One exemplary embodiment provides a method of manufacturing a display device, including: forming a gate electrode on a substrate; forming a gate insulating layer on the gate electrode; forming an active pattern on the gate insulating layer; forming a first mask pattern on the gate insulating layer and the active pattern; forming an insulating interlayer on the gate insulating layer, the active pattern, and the first mask pattern; forming a second mask pattern on the insulating interlayer, the second mask pattern comprising an opening that exposes a region where the first mask pattern is formed; forming contact holes exposing portions of the active pattern by patterning the insulating interlayer using the first mask pattern and the second mask pattern; forming a source electrode and a drain electrode on the gate insulating layer by filling the contact holes, the drain electrode spaced apart from the source electrode; forming a first electrode electrically connected to the drain electrode; forming a light emitting layer connected to the first electrode; and forming a second electrode connected to the light emitting layer.

According to example embodiments, the active pattern may be formed on the gate insulating layer, and then the first mask pattern, the insulating interlayer, and the second mask pattern may be sequentially formed on the active pattern. Accordingly, the active pattern may be entirely covered by the first mask pattern, the insulating interlayer, and the second mask pattern, so that the carrier concentration of the active pattern may not be changed.

Additionally, the oxide semiconductor device having the active pattern according to example embodiments may obtain an enhanced electrical characteristic by preventing deterioration of electrical characteristics such as the reduction of the bias current, the increase of the threshold voltage distribution, and the reduction of mobility. When the oxide semiconductor device is employed in a display device such as an organic light emitting display device, a liquid crystal display device, a flexible display device, etc., the display device having the oxide semiconductor device can have advantages such as a reduced thickness, improved image resolutions, and an improved operating speed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
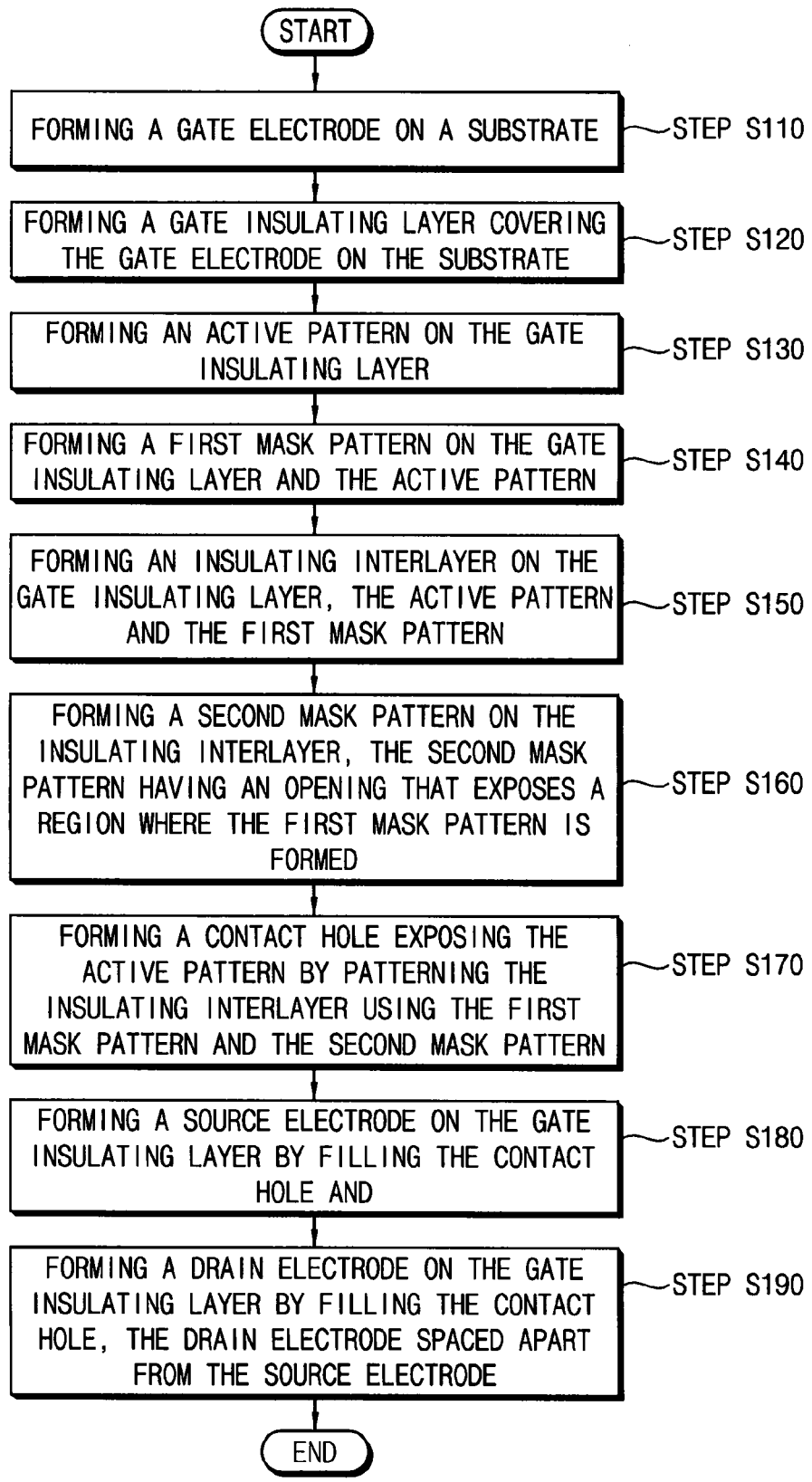
FIG. 1 is a flow chart illustrating a method of manufacturing an oxide semiconductor device in accordance with example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that when an element is referred to as being "on," "connected to," or "coupled to" another element, it can be directly on, connected to, or coupled to the other element or intervening elements may be present. In contrast, when an element is referred to as being "directly on," "directly connected to," or "directly coupled to" another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of manufacturing an oxide semiconductor device in accordance with example embodiments. FIGS. 2 through 9 are diagrams for describing a method of manufacturing an oxide semiconductor device in accordance with example embodiments.

Referring to FIGS. 1 through 9, an oxide semiconductor device may be manufactured by: forming a gate electrode on a substrate (Step S110); forming a gate insulating layer covering the gate electrode on the substrate (Step S120); forming an active pattern on the gate insulating layer (Step S130); forming a first mask pattern on the gate insulating layer and the active pattern (Step S140); forming an insulating interlayer on the gate insulating layer, the active pattern, and the first mask pattern (Step S150); forming, on the insulating interlayer, a second mask pattern having an opening that exposes a region where the first mask pattern is formed (Step S160); forming a contact hole exposing the active pattern by patterning the insulating interlayer using the first mask pattern and the second mask pattern (Step S170); forming a source electrode on the gate insulating layer by filling the contact hole (Step S180); and forming a drain electrode spaced apart by a predetermined distance from the source electrode on the gate insulating layer by filling the contact hole (Step S190).

Figure 2:
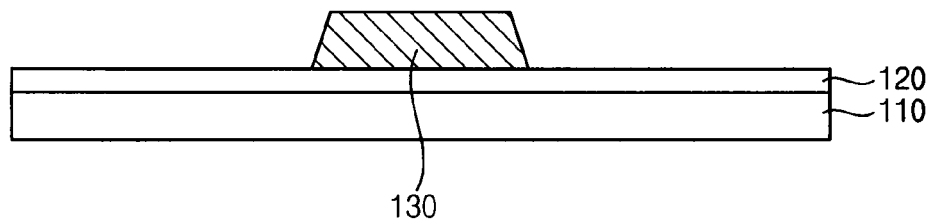
FIGS. 2 through 9 are diagrams for describing a method of manufacturing an oxide semiconductor device in accordance with example embodiments.

As illustrated in FIG. 2, the gate electrode 130 may be formed on the substrate 110 including an insulating substrate that may be transparent, for instance, such as a glass substrate, a transparent resin substrate, a transparent metal oxide substrate, etc. In example embodiments, a first conductive layer (not shown) may be formed on the substrate 110. Thereafter, the first conductive layer may be partially etched by a photolithography process or an etching process using an additional etching mask. Hence, the gate electrode 130 may be provided on the substrate 110. The first conductive layer may be formed, for instance, by a sputtering process, a chemical vapor deposition (CVD) process, an atomic layer deposition (ALD) process, a vacuum evaporation process, a printing process, etc. In example embodiments, a gate line may also be formed on the substrate 110 while the gate electrode 130 is formed on the substrate 110. The gate line may be coupled to the gate electrode 130, and the gate line may extend along a first direction on the substrate 110.

In example embodiments, the gate electrode 130 may be formed of aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. (x: natural number). These may be used alone or in a combination thereof. In example embodiments, the gate electrode 130 may have a single layer structure or a multi layer structure, which may include a metal film, an alloy film, a metal nitride film, a conductive metal oxide film and/or a transparent conductive film.

In other example embodiments, a transparent conductive material may be formed on the substrate 110. Thereafter, the transparent conductive material may be partially etched by a photolithography process or an etching process using an additional etching mask. Hence, the gate electrode 130 formed of a transparent conductive material may be provided on the substrate 110. For example, the transparent conductive material may include indium tin oxide, indium zinc oxide, zinc oxide, tin oxide, gallium oxide, indium oxide, etc. These may be used alone or in a combination thereof.

As illustrated in FIG. 2, a buffer layer 120 may be additionally formed on the substrate 110 in accordance with one exemplary embodiment. Thereafter, the gate electrode 130 may be formed on the buffer layer 120. The buffer layer 120 may be obtained on the substrate 110, for instance, by a spin coating process, a chemical vapor deposition (CVD) process, a plasma enhanced chemical vapor deposition (PECVD) process, a high density plasma-chemical vapor deposition (HDP-CVD) process, a printing process, etc. For example, the buffer layer 120 may include silicon oxide (SiOx), silicon nitride (SiNx), silicon oxynitride (SiOxNy), silicon oxycarbide (SiOxCy), silicon carbon nitride (SiCxNy), etc. (x, y: natural numbers). These may be used alone or in a mixture thereof. In example embodiments, the buffer layer 120 may prevent diffusion of metal atoms and/or impurities from the substrate 110. Additionally, when the substrate 110 has the buffer layer 120 formed thereon, the gate electrode 130 may be easily formed because the stress generated during the formation of the gate electrode 130 is decreased by the buffer layer 120.

Figure 3:
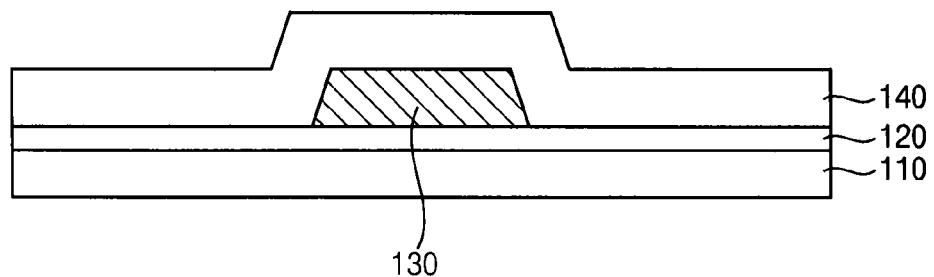

As illustrated in FIG. 3, the gate insulating layer 140 may be formed on the substrate 110 to cover the gate electrode 130.

The gate insulating layer 140 may be formed, for instance, by a CVD process, a thermal oxidation process, a plasma enhanced chemical vapor deposition (PECVD) process, a high density plasma-chemical vapor deposition (HDP-CVD) process, etc. For example, the gate insulating layer 140 may include silicon oxide, metal oxide, etc. Examples of the metal oxide in the gate insulating layer 140 may include hafnium oxide (HfOx), aluminum oxide (AlOx), zirconium oxide (ZrOx), titanium oxide (TiOx), tantalum oxide (TaOx), etc. (x: natural number). These may be used alone or in a combination thereof. In example embodiments, the gate insulating layer 140 may sufficiently cover the gate electrode 130 and may have a flat upper surface. In example embodiments, a planarization process may be performed on the gate insulating layer 140 to enhance the flatness of the gate insulating layer 140. For example, the gate insulating layer 140 may have a substantially level surface by a chemical mechanical polishing (CMP) process, an etch-back process, etc.

Figure 4:
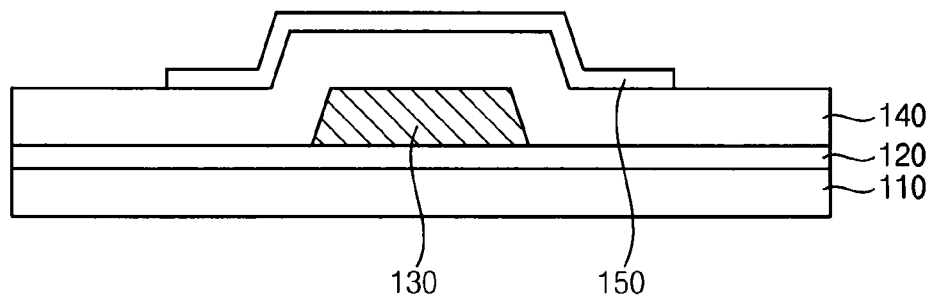

As illustrated in FIG. 4, an active layer (not shown) may be formed on the gate insulating layer 140.

The active layer may be formed, for instance, by a sputtering process, a CVD process, a printing process, a spray process, a vacuum deposition process, an ALD process, a sol-gel process, PECVD process, etc. The active layer may be partially etched by a photolithography process or an etching process using an additional etching mask. Hence, the active pattern 150 may be provided on the gate insulating layer 140.

The active layer may include a binary compound containing indium (In), zinc (Zn), gallium (Ga), titanium (Ti), aluminum (Al), halfnium (Hf), zirconium (Zr), magnesium (Mg), etc, a ternary compound, a quaternary compound, etc. These may be used alone or in a combination thereof. In other example embodiments, the active layer may include a semiconductor oxide containing at least one of indium (In), zinc (Zn), gallium (Ga), stannum (Sn), titanium (Ti), aluminum (Al), hafnium (Hf), zirconium (Zr), and magnesium (Mg). In some example embodiments, the active layer may include a semiconductor oxide doped lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), rubidium (Ru), germanium (Ge), stannum (Sn), fluorine (F), etc. These may be used alone or in a mixture thereof. In still other example embodiments, the active layer may include amorphous silicon, poly silicon, silicon partially crystallized, silicon containing microcrystalline, etc. These may be used alone or in a combination thereof.

Figure 5:
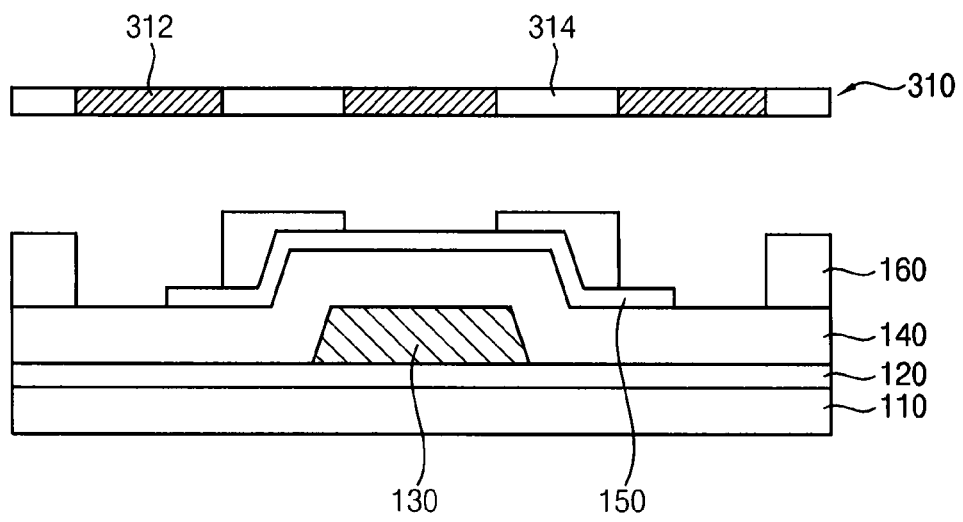

As illustrated in FIG. 5, the first mask layer (not shown) may be formed on the gate insulating layer 140 and the active pattern 150.

In example embodiments, the first mask layer may be formed of a positive or negative type photoresist. For instance, the first mask may be a negative type photoresist, of which an exposure region is set to remain. In this case, the negative type photoresist may be applied on the gate insulating layer 140 and the active pattern 150, for instance, by using a spin coating process. Alternatively, the first mask layer may be formed using the silicon oxide, the silicon nitride, the silicon oxynitride, etc. These may be used alone or in a combination thereof. In this case, the first mask layer may be formed, for instance, by a CVD process, an ALD process, a PECVD process, a HDP-CVD process, etc.

In example embodiments, the first mask layer may be partially etched using a mask 310. Hence, the first mask pattern 160 may be provided on the gate insulating layer 140 and the active pattern 150.

In example embodiments, the mask 310 may include a light-blocking portion 312 and a light-transmitting portion 314. For example, light may be blocked by the light-blocking portion 312 and may be transmitted through the light-transmitting portion 314. In this case, the light-blocking portion 312 may be positioned over a region where a contact hole is not to be formed, and the light-transmitting portion 314 may be positioned over a region where a contact hole is to be formed.

When the first mask layer includes the negative type photoresist, the first mask pattern 160 may be formed, for instance, by an exposure process, a developing process, etc. Alternatively, when the first mask layer includes the oxide, the nitride, and the oxynitride, the first mask pattern 160 may be formed by a photolithography process or an etching process using an additional etching mask. Accordingly, the channel layer of the active pattern 150 may be protected from damage that may be caused by residues (e.g., a metal compound), which may be created during the formation of the source electrode 190a and the drain electrode 190b.

Figure 6:
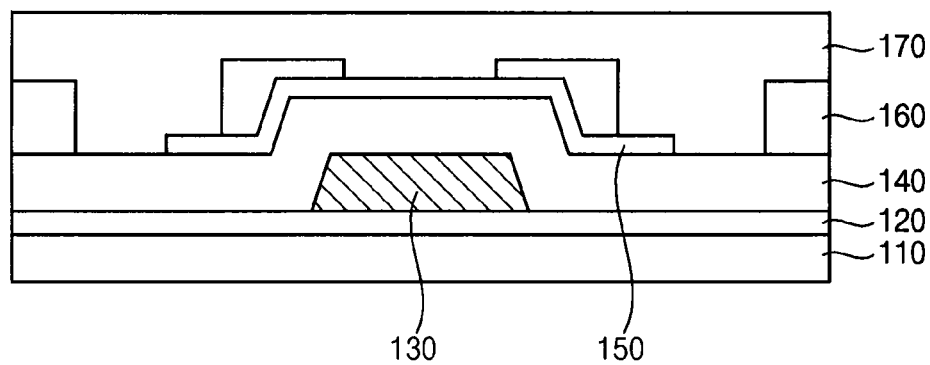

As illustrated in FIG. 6, the insulating interlayer 170 may be formed on the gate insulating layer 140 and the active pattern 150 on which the first mask pattern 160 is disposed.

The insulating interlayer 170 may be obtained, for instance, by a CVD process, a thermal oxidation process, a PECVD process, a HDP-CVD process, etc. For example, the insulating interlayer 170 may be formed of silicon oxide, silicon nitride, silicon oxynitride, silicon oxycarbide and/or silicon carbon nitride. These may be used alone or in a combination thereof. The insulating interlayer 170 may have a single layer structure or a multi layer structure, which may include a silicon oxide film, a silicon nitride film, a silicon oxynitride film, a silicon oxycarbide film and/or a silicon carbon nitride film. In this case, the thickness of the insulating interlayer 170 may be substantially the same as the thickness of an insulating interlayer of a conventional oxide semiconductor device. For example, the thickness of the insulating interlayer 170 may be about 2000 Å through about 3000 Å.

Figure 7:
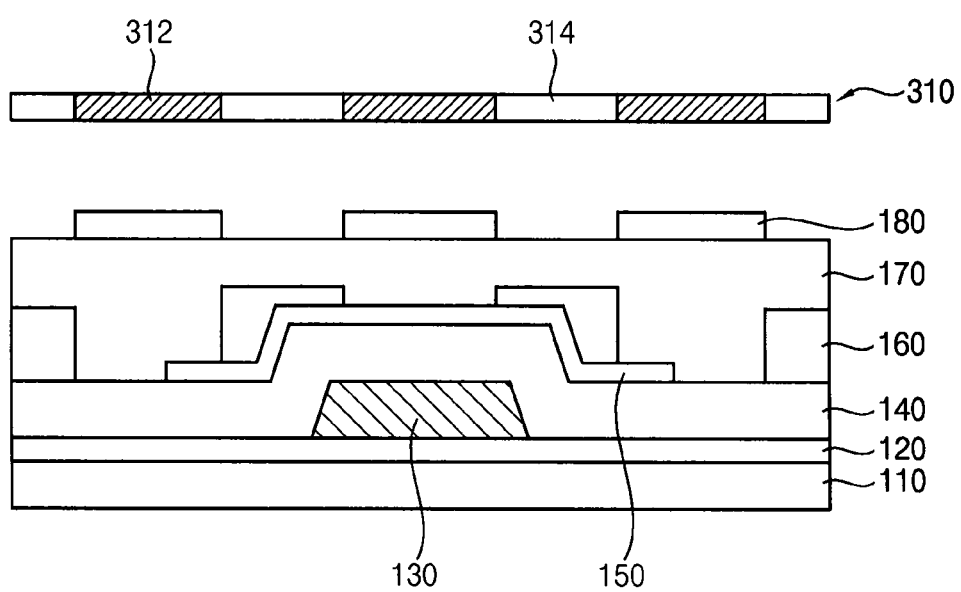

As illustrated in FIG. 7, a second mask layer may be formed on the insulating interlayer 170 by using the mask 310.

In example embodiments, the second mask layer may be formed of a positive or negative type photoresist. For instance, the second mask layer may be a positive type photoresist, of which an exposure region is set to remain. In this case, the positive type photoresist may be applied on the gate insulating layer 140 and the active pattern 150, for instance, by a spin coating process. Alternatively, the second mask layer may be formed of the silicon oxide, the silicon nitride, the silicon oxynitride, etc. These may be used alone or in a combination thereof. In this case, the second mask layer may be formed by a CVD process, an ALD process, a PECVD process, a HDP-CVD process, etc.

In example embodiments, the second mask layer may be partially etched using a mask 310. Hence, the second mask pattern 180 may be provided on the gate insulating layer 140 and the active pattern 150. In this case, the second mask pattern 180 may expose a region where the first mask pattern 160 is formed.

In example embodiments, the mask 310 may include a light-blocking portion 312 and a light-transmitting portion 314. For example, light may be blocked by the light-blocking portion 312 and may be transmitted through the light-transmitting portion 314. In this case, the light-blocking portion 312 may be positioned over a region where a contact hole is not to be formed, and the light-transmitting portion 314 may be positioned over a region where a contact hole is to be formed.

When the second mask layer includes the positive type photoresist, the second mask pattern 180 may be formed by an exposure process, a developing process, etc. Alternatively, when the second mask layer includes the oxide, the nitride, and the oxynitride, the second mask pattern 180 may be formed by a photolithography process or an etching process using an additional etching mask. Accordingly, the channel layer of the active pattern 150 may be protected from damage that may be caused by residues (e.g., a metal compound), which may be created during the formation of the source electrode 190*a* and the drain electrode 190*b*.

In example embodiments, the mask 310 may correspond to an insulating interlayer patterning mask used in a conventional method of manufacturing an oxide semiconductor device. Furthermore, since the first mask pattern 160 and the second mask pattern 180 may be formed by using the same mask, the masks required for manufacturing the oxide semiconductor device may be saved.

In example embodiments, the first mask pattern 160 may have a thickness that is substantially the same as the thickness of the second mask pattern 180. However, the present inventive concept is not limited thereto.

In example embodiments, the first mask pattern 160 may cover a region where a contact hole is to be formed. Accordingly, the gate insulating layer 140 and the active pattern 150 may be protected from damage that may be caused by residues (e.g., metal compounds), which may be created during the formation of the source electrode 190*a* and the drain electrode 190*b*.

Figure 8:
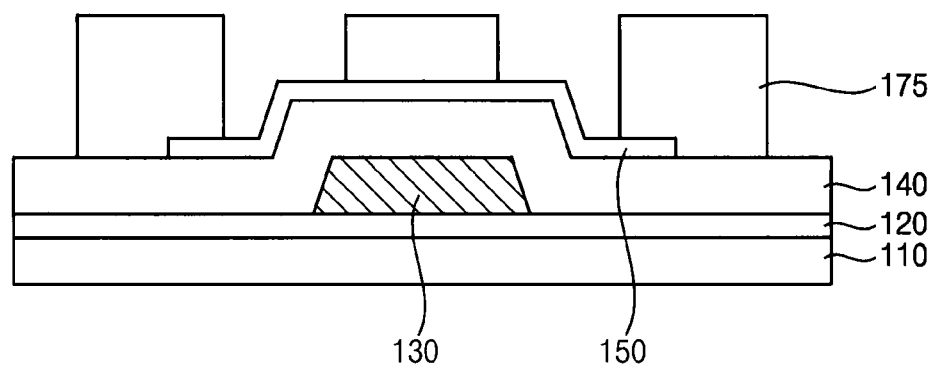

As illustrated in FIG. 8, the first mask pattern 160 and the second mask pattern 180 may be removed.

When the first mask pattern 160 includes the negative type photoresist, the first mask pattern 160 may be removed, for instance, by a stripping process, an ashing process, etc. Additionally, when the second mask pattern 180 includes the negative type photoresist, the second mask pattern 180 may be removed, for instance, by a stripping process, an ashing process, etc. Alternatively, when each of the first mask pattern 160 and the second mask pattern 180 includes an oxide, a nitride, and an oxynitride, the first mask pattern 160 and the second mask pattern 180 may be removed by an etching solution containing phosphoric acid, an etching gas containing phosphoric acid, an etching solution containing hydrofluoric acid, an etching gas containing hydrofluoric acid, etc. Accordingly, the insulating interlayer 170 may have at least one contact hole that partially exposes a source region and a drain region.

Figure 9:
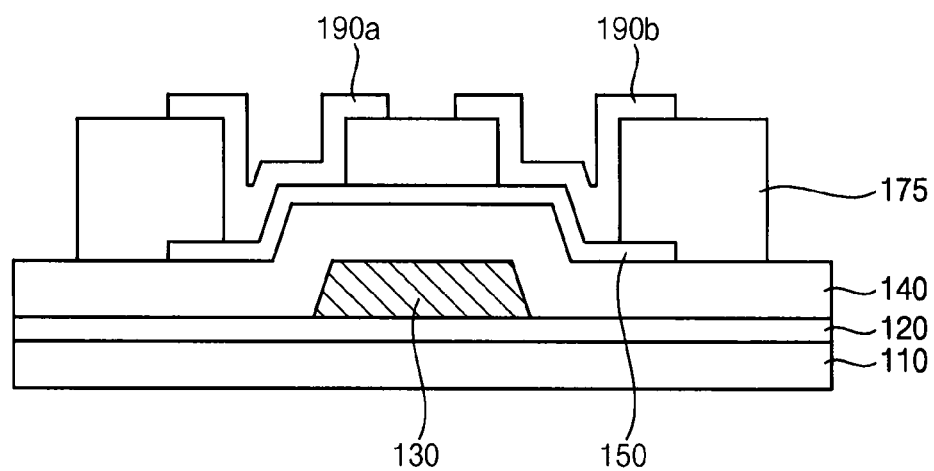

As illustrated in FIG. 9, the second conductive layer may be formed on the insulating interlayer 170 by filling the contact holes. The second conductive layer may be formed, for instance, by a sputtering process, a CVD process, an ALD process, a vacuum deposition process, a printing process, etc.

In example embodiments, the insulating interlayer 170 may be partially etched to form contact holes exposing the source and the drain regions, respectively. Then, the second conductive layer may be formed on the insulating interlayer 170 by filling the contact holes. The second conductive layer may be removed until the insulating interlayer 170 is exposed, so that the source and the drain electrodes 190*a* and 190*b* may be formed on the source and the drain regions, respectively.

Each of the source and the drain electrodes 190*a* and 190*b* may include metal, alloy, metal nitride, conductive metal oxide, a transparent conductive material, etc. For example, the source and the drain electrodes 190*a* and 190*b* may be formed of aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, each of the source and the drain electrodes 190*a* and 190*b* may have a single layer structure or a multi layer structure, which may include a metal film, an alloy film, a metal nitride film, a conductive metal oxide film and/or a transparent conductive film.

In the oxide semiconductor device described with reference to FIGS. 1 through 9, the switching device including the thin film transistor may have a bottom gate structure in which the gate electrode 130 may be disposed under the active pattern 150. However, the configuration of the switching device may not be limited thereto. For example, the switching device may have a top gate structure in which the gate electrode 130 may be disposed on the active pattern 150.

In a conventional method of manufacturing an oxide semiconductor device, the carrier concentration of the channel layer of the active pattern may be changed while the source electrode and the drain electrode are formed. Thus, the characteristics of the active pattern may be adversely affected, which will likely result in the deterioration of electrical characteristics of the oxide semiconductor device, such as the increase of the threshold voltage distribution, the reduction of mobility, the reduction of an operating current, etc.

However, in the method of manufacturing the oxide semiconductor device according to example embodiments, the first mask pattern 160, the insulating interlayer 170, and the second mask pattern 180 may be sequentially formed on the active pattern 150. Accordingly, the active pattern 150 may not be exposed, so that the carrier concentration of the channel layer of the active pattern 150 is less likely to change during the formation of the source electrode 190*a* and the drain electrode 190*b*.

In the oxide semiconductor device manufactured by the method according to example embodiments may obtain enhanced electrical characteristics, such as the increase of the bias current, the reduction of the threshold voltage distribution, the increase of mobility in the channel region, etc.

Accordingly, when such an oxide semiconductor device is employed in a display device such as an organic light emitting display device, a liquid crystal display device, a flexible display device, etc., the display device having the oxide semiconductor device may have advantageous characteristics such as a reduced thickness, improved image qualities, and an improved operating speed.

Figure 10A:
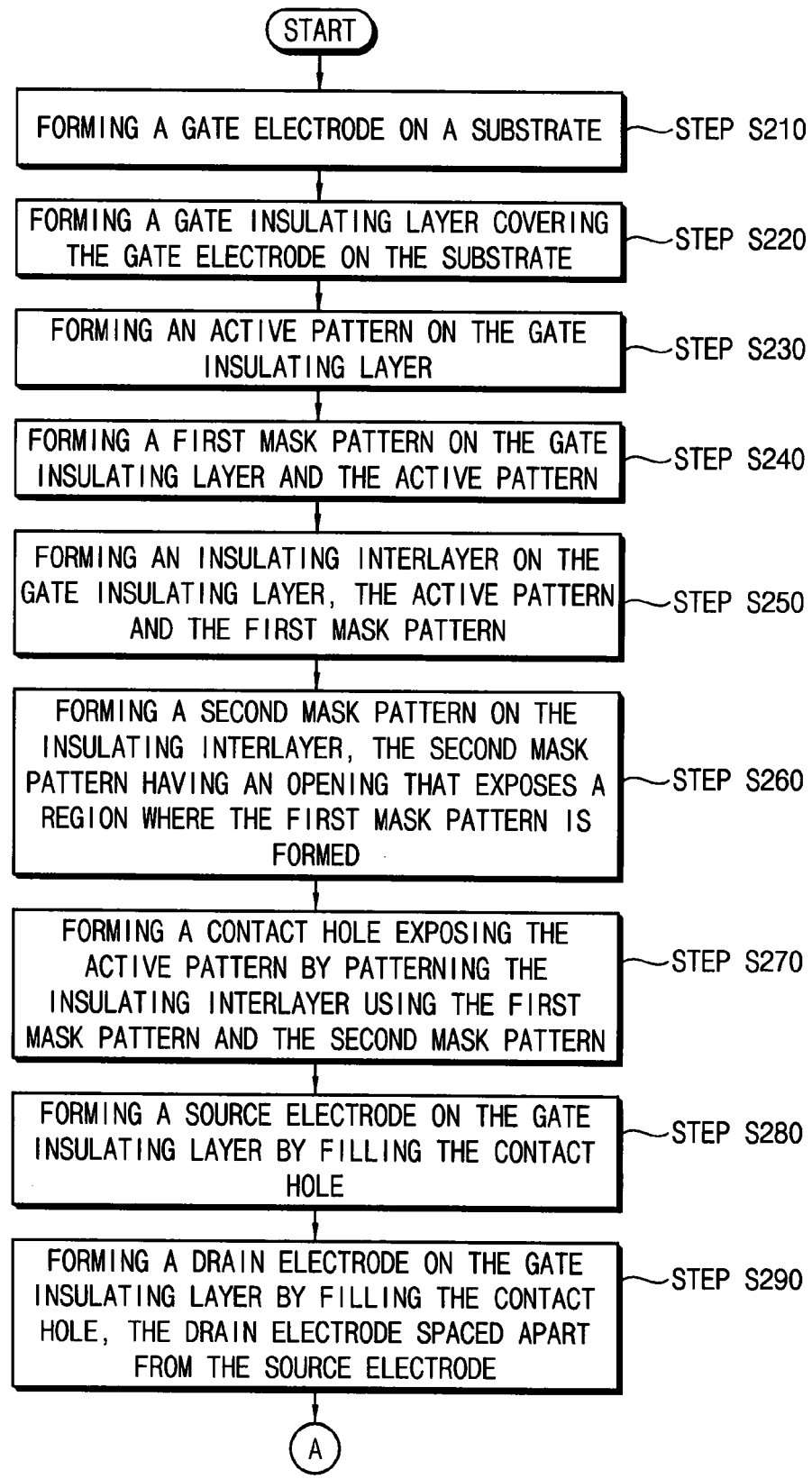
FIGS. 10A and 10B are flow charts illustrating a method of manufacturing a display device in accordance with example embodiments.

FIGS. 10A and B are flow charts illustrating a method of manufacturing a display device in accordance with example embodiments. FIGS. 11 through 18 are diagrams for describing a method of manufacturing an oxide semiconductor device in accordance with example embodiments. The descriptions that have been made with reference to FIGS. 2-9 and can commonly apply to FIGS. 11-18 are not repeated.

Figure 10B:
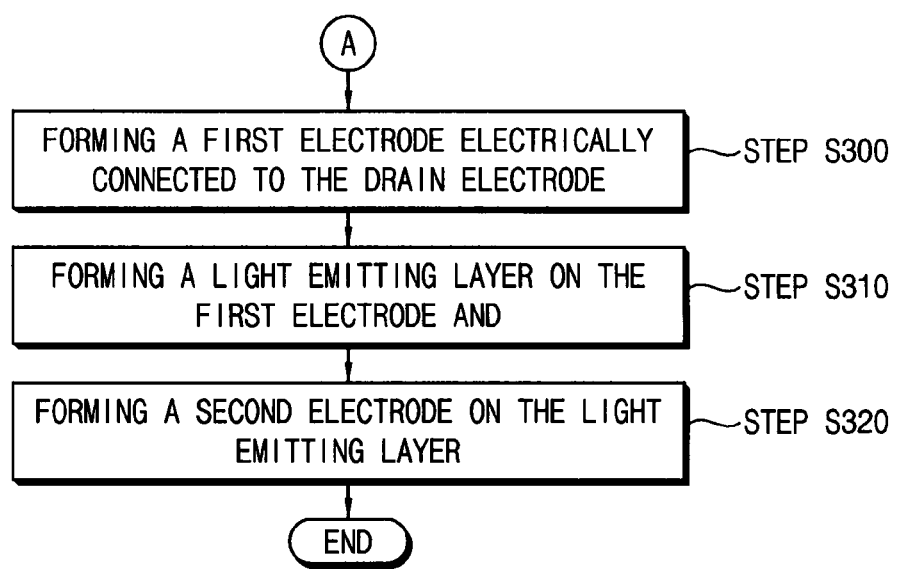

Referring to FIGS. 10A through 18, the method of FIGS. 10A and 10B relates to manufacturing a display device by: forming a gate electrode on a substrate (Step S210); forming a gate insulating layer on the substrate, the gate insulating layer covering the gate electrode (Step S220); forming an active pattern on the gate insulating layer (Step S230); forming a first mask pattern on the gate insulating layer and the active pattern (Step S240); forming an insulating interlayer on the gate insulating layer, the active pattern and the first mask pattern (Step S250); forming a second mask pattern on the insulating interlayer, the second mask pattern opening a region where the first mask pattern is formed (Step S260); patterning the insulating interlayer using the first mask pattern and the second mask pattern to form a contact hole exposing the active pattern (Step S270); forming a source electrode on the gate insulating layer to fill the contact hole (Step S280); forming a drain electrode on the gate insulating layer to fill the contact hole, the drain electrode being separated by a predetermined distance (Step S290); forming a first electrode electrically connected to the drain electrode (Step S300); forming a light emitting layer on the first electrode (Step S310); and forming a second electrode on the light emitting layer (Step S320).

Figure 11:
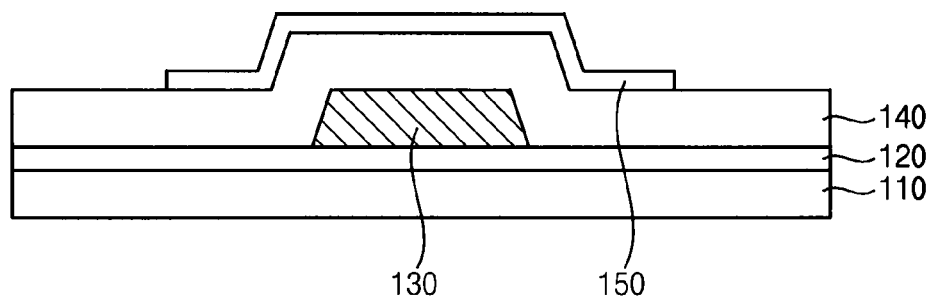
FIGS. 11 through 18 are diagrams for describing a method of manufacturing an oxide semiconductor device in accordance with example embodiments.

As illustrated in FIG. 11, the gate electrode 130 may be formed on the substrate 110 including an insulating substrate that may be transparent, for instance, such as a glass substrate, a transparent resin substrate, a transparent metal oxide substrate, etc. In example embodiments, a first conductive layer (not shown) may be formed on the substrate 110. Thereafter, the first conductive layer may be partially etched by a photolithography process or an etching process using an additional etching mask. Hence, the gate electrode 130 may be provided on the substrate 110. The first conductive layer may be formed, for instance, by a sputtering process, a chemical vapor deposition (CVD) process, an atomic layer deposition (ALD) process, a vacuum evaporation process, a printing process, etc.

A buffer layer 120 may be additionally formed on the substrate 110 in accordance with one exemplary embodiment. Thereafter, the gate electrode 130 may be formed on the buffer layer 120. The buffer layer 120 may be obtained on the substrate 110, for instance, by a spin coating process, a chemical vapor deposition (CVD) process, a plasma enhanced chemical vapor deposition (PECVD) process, a high density plasma-chemical vapor deposition (HDP-CVD) process, a printing process, etc.

The gate insulating layer 140 may be formed on the substrate 110 to cover the gate electrode 130. The gate insulating layer 140 may be formed, for instance, by a CVD process, a thermal oxidation process, a plasma enhanced chemical vapor deposition (PECVD) process, a high density plasma-chemical vapor deposition (HDP-CVD) process, etc.

An active layer (not shown) may be formed on the gate insulating layer 140. The active layer may be formed, for instance, by a sputtering process, a CVD process, a printing process, a spray process, a vacuum deposition process, an ALD process, a sol-gel process, PECVD process, etc.

Figure 12:
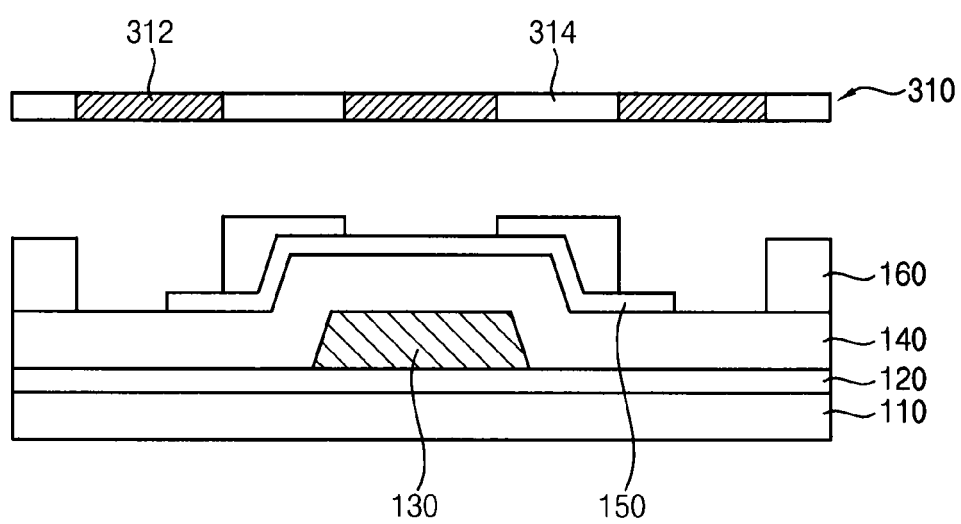

As illustrated in FIG. 12, the first mask layer (not shown) may be formed on the gate insulating layer 140 and the active pattern 150.

In example embodiments, the first mask layer may be formed of a positive or negative type photoresist. For instance, the first mask layer may be a negative type photoresist, of which an exposure region is set to remain. In this case, the negative type photoresist may be applied on the gate insulating layer 140 and the active pattern 150, for instance, by using a spin coating process. Alternatively, the first mask layer may be formed using the silicon oxide, the silicon nitride, the silicon oxynitride, etc. These may be used alone or in a combination thereof. In this case, the first mask layer may be formed, for instance, by a CVD process, an ALD process, a PECVD process, a HDP-CVD process, etc.

In example embodiments, the first mask layer may be partially etched using a mask 310. Hence, the first mask pattern 160 may be provided on the gate insulating layer 140 and the active pattern 150.

In example embodiments, the mask 310 may include a light-blocking portion 312 and a light-transmitting portion 314. For example, light may be blocked by the light-blocking portion 312 and may be transmitted through the light-transmitting portion 314. In this case, the light-blocking portion 312 may be positioned over a region where a contact hole is not to be formed, and the light-transmitting portion 314 may be positioned over a region where a contact hole is to be formed.

When the first mask layer includes the negative type photoresist, the first mask pattern 160 may be formed, for instance, by an exposure process, a developing process, etc. Alternatively, when the first mask layer includes the oxide, the nitride and the oxynitride, the first mask pattern 160 may be formed by a photolithography process or an etching process using an additional etching mask. Accordingly, the channel layer of the active pattern 150 may be protected from damage that may be caused by residues (e.g., a metal compound), which may be created during the formation of the source electrode 190a and the drain electrode 190b.

Figure 13:
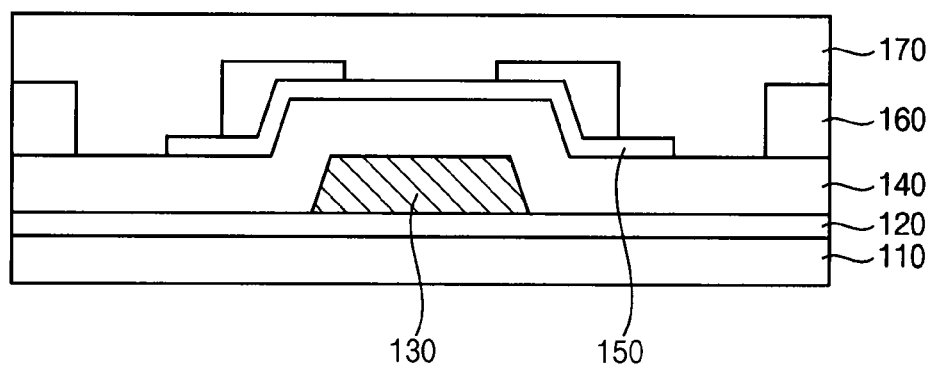

As illustrated in FIG. 13, the insulating interlayer 170 may be formed on the gate insulating layer 140 and the active pattern 150 on which the first mask pattern 160 is disposed. The insulating interlayer 170 may be obtained, for instance, by a CVD process, a thermal oxidation process, a PECVD process, a HDP-CVD process, etc.

Figure 14:
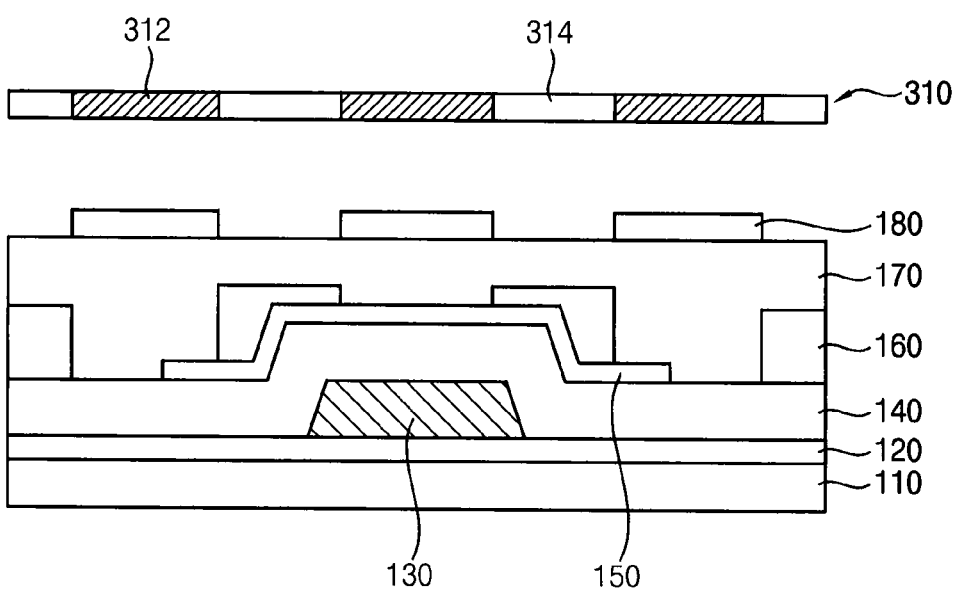

As illustrated in FIG. 14, a second mask layer may be formed on the insulating interlayer 170 by using the mask 310.

In example embodiments, the second mask layer may be formed of a positive or negative type photoresist. For instance, the second mask layer may be a positive type photoresist, of which an exposure region is set to remain. In this case, the positive type photoresist may be applied on the gate insulating layer 140 and the active pattern 150, for instance, by a spin coating process. Alternatively, the second mask layer may be formed of the silicon oxide, the silicon nitride, the silicon oxynitride, etc. These may be used alone or in a combination thereof. In this case, the second mask layer may be formed by a CVD process, an ALD process, a PECVD process, a HDP-CVD process, etc.

In example embodiments, the second mask layer may be partially etched using a mask 310. Hence, the second mask pattern 180 may be provided on the gate insulating layer 140 and the active pattern 150. In this case, the second mask pattern 180 may expose a region where the first mask pattern 160 is formed.

In example embodiments, the mask 310 may include a light-blocking portion 312 and a light-transmitting portion 314. For example, light may be blocked by the light-blocking portion 312 and may be transmitted through the light-transmitting portion 314. In this case, the light-blocking portion 312 may be positioned over a region where a contact hole is not to be formed, and the light-transmitting portion 314 may be positioned over a region where a contact hole is to be formed.

When the second mask layer includes the positive type photoresist, the second mask pattern 180 may be formed by an exposure process, a developing process, etc. Alternatively, when the second mask layer includes the oxide, the nitride, and the oxynitride, the second mask pattern 180 may be formed by a photolithography process or an etching process using an additional etching mask. Accordingly, the channel layer of the active pattern 150 may be protected from damage that may be caused by residues (e.g., a metal compound), which may be created during the formation of the source electrode 190*a* and the drain electrode 190*b*.

In example embodiments, the mask 310 may correspond to an insulating interlayer patterning mask used in a conventional method of manufacturing an oxide semiconductor device. Furthermore, since the first mask pattern 160 and the second mask pattern 180 may be formed by using the same mask, the masks required for manufacturing the oxide semiconductor device may be saved.

In example embodiments, the first mask pattern 160 may have a thickness that is substantially the same as the thickness of the second mask pattern 180. However, the present inventive concept is not limited thereto.

In example embodiments, the first mask pattern 160 may cover a region where a contact hole is to be formed. Accordingly, the gate insulating layer 140 and the active pattern 150 may be protected from damage that may be caused by residues (e.g., metal compounds), which may be created during the formation of the source electrode 190*a* and the drain electrode 190*b*.

Figure 15:
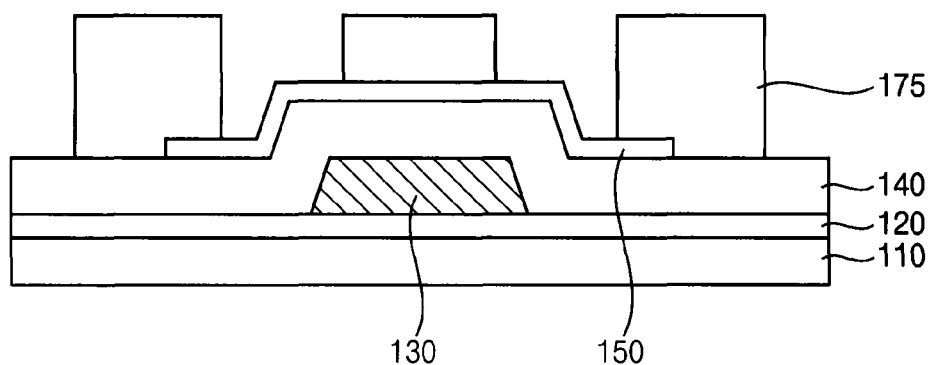

As illustrated in FIG. 15, the first mask pattern 160 and the second mask pattern 180 may be removed.

When the first mask pattern 160 includes the negative type photoresist, the first mask pattern 160 may be removed, for instance, by a stripping process, an ashing process, etc. Additionally, when the second mask pattern 180 includes the negative type photoresist, the second mask pattern 180 may be removed, for instance, by a stripping process, an ashing process, etc. Alternatively, when each of the first mask pattern 160 and the second mask pattern 180 includes an oxide, a nitride and an oxynitride, the first mask pattern 160 and the second mask pattern 180 may be removed by an etching solution containing phosphoric acid, an etching gas containing phosphoric acid, an etching solution containing hydrofluoric acid, an etching gas containing hydrofluoric acid, etc. Accordingly, the insulating interlayer 170 may have at least one contact hole that partially exposes a source region and a drain region.

Figure 16:
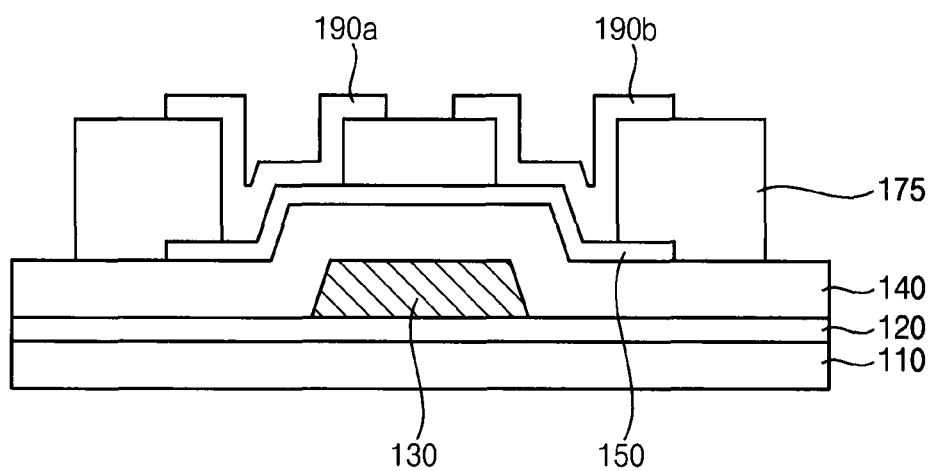

As illustrated in FIG. 16, the second conductive layer may be formed on the insulating interlayer 170 by filling the contact holes. The second conductive layer may be formed, for instance, by a sputtering process, a CVD process, an ALD process, a vacuum deposition process, a printing process, etc. In example embodiments, the insulating interlayer 170 may be partially etched to form contact holes exposing the source and the drain regions, respectively. Then, the second conductive layer may be formed on the insulating interlayer 170 by filling the contact holes. The second conductive layer may be removed until the insulating interlayer 170 is exposed, so that the source and the drain electrodes 190*a* and 190*b* may be formed on the source and the drain regions, respectively.

In a conventional method of manufacturing an oxide semiconductor device, the carrier concentration of the channel layer of the active pattern may be changed while the source electrode and the drain electrode are formed. Thus, the characteristics of the active pattern may be adversely affected, which will likely result in the deterioration of electrical characteristics of the oxide semiconductor device, such as the increase of the threshold voltage distribution, the reduction of mobility, the reduction of an operating current, etc.

However, in the method of manufacturing the oxide semiconductor device according to example embodiments, the first mask pattern 160, the insulating interlayer 170, and the second mask pattern 180 may be sequentially formed on the active pattern 150. Accordingly, the active pattern 150 may not be exposed, so that the carrier concentration of the channel layer of the active pattern 150 is less likely to be affected during the formation of the source electrode 190*a* and the drain electrode 190*b*.

In the oxide semiconductor device manufactured by the method according to example embodiments may obtain enhanced electrical characteristics, such as the increase of the bias current, the reduction of the threshold voltage distribution, and the increase of mobility in the channel region, etc.

Accordingly, when such an oxide semiconductor device is employed in a display device such as an organic light emitting display device, a liquid crystal display device, a flexible display device, etc, the display device having the oxide semiconductor device may have advantageous characteristics such as a reduced thickness, improved image qualities, and an improved operating speed.

Figure 17:
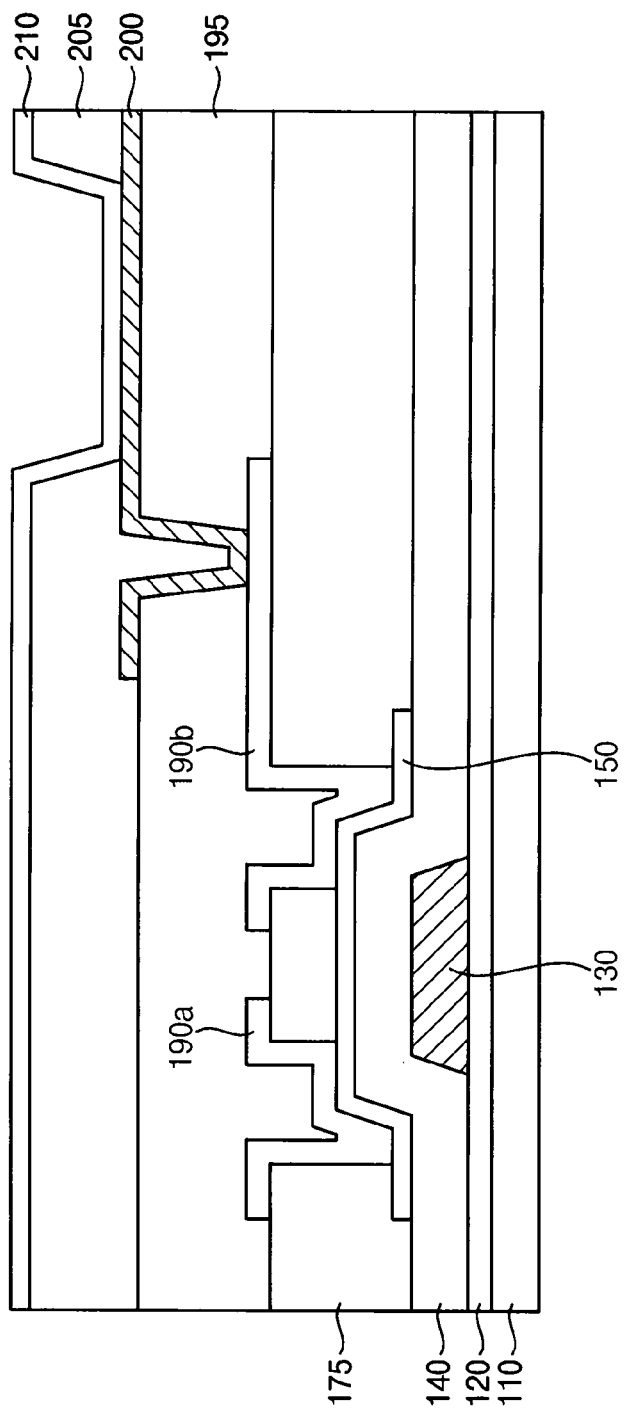

As illustrated in FIG. 17, a first electrode layer (not shown) may be formed on the insulating layer 195. In example embodiments, the first electrode layer may include a transparent conductive material, a semi-transparent conductive material, a reflective conductive material, etc. The first electrode layer may be patterned to form a first electrode 200 connected to the drain electrode 190*b*. In this case, the first electrode 200 may correspond to a pixel electrode of the display device.

A pixel defining layer 205 may be formed on the first electrode 200. In example embodiments, the pixel defining layer 205 may be formed of an insulating layer, for instance, that may be transparent. For example, the pixel defining layer 205 may be formed of an organic material (e.g., polyacryl-based resin, polyimide-based resin, etc), a silica-based inorganic material, etc.

The pixel defining layer 205 may be partially etched to form an opening that exposes the first electrode 200. For example, the opening may be formed by a photolithography process or an etching process using an additional etching mask.

Figure 18:
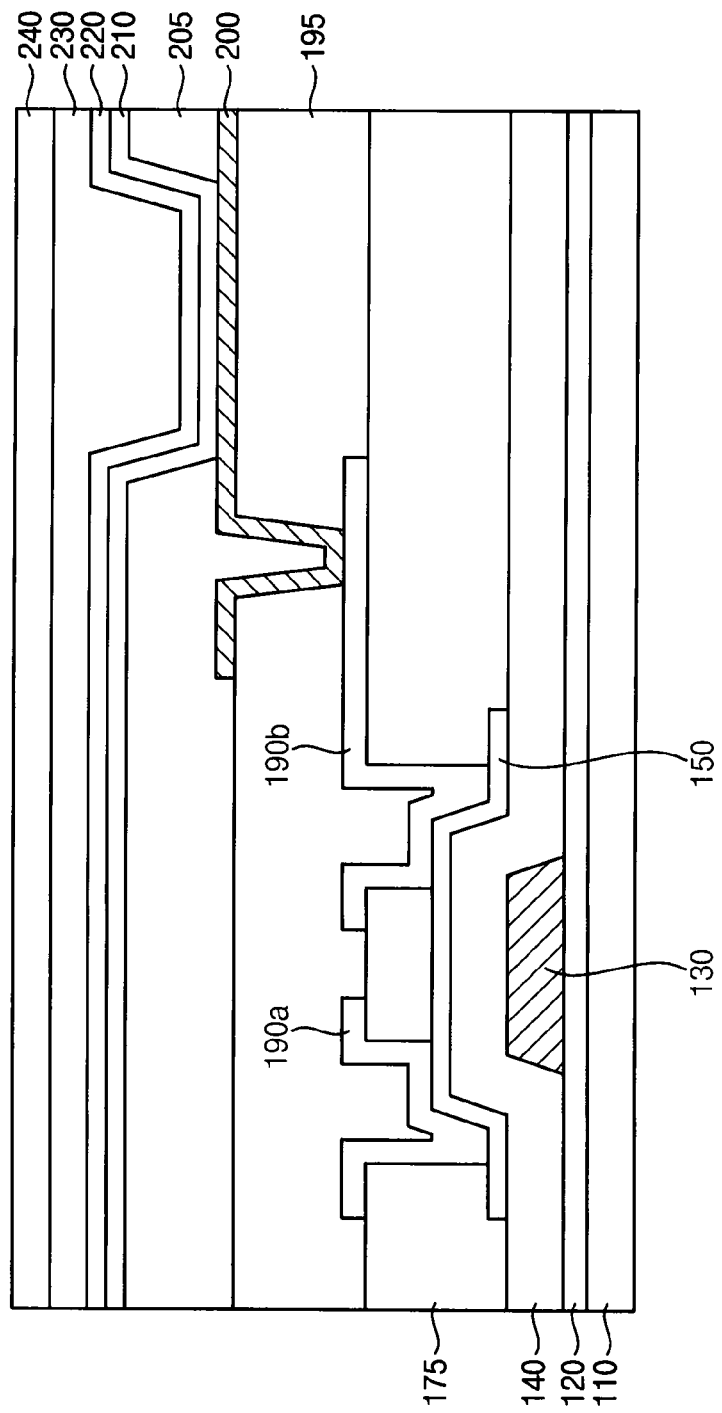

As illustrated in FIG. 18, an organic light emitting layer 210 may be formed on the first electrode 200 and the pixel defining layer 205. The organic light emitting layer 210 may be formed by using a low-molecular organic material, a high-molecular organic material, etc. Additionally, the organic light emitting layer 210 may have a multi layer structure, which may include a hole injection layer, a hole transfer layer, an emitting layer, an electron transfer layer, an electron injection layer, etc.

The second electrode 220 may be formed on the organic light emitting layer 210. In example embodiments, the second electrode 220 may include a transparent conductive material, a semi-transparent conductive material, a reflective conductive material, etc.

A protecting layer 230 may be formed on the second electrode 220. The protecting layer 230 may be formed of an insulating layer that may be transparent, for instance, such as a glass, a transparent resin, a transparent ceramic, etc. In other example embodiments, a second substrate may be formed on the protecting layer 230. In this case, the second substrate may substantially oppose the substrate 110 corresponding to a first substrate. For example, the second substrate may include a transparent insulating material.

Figure 19:
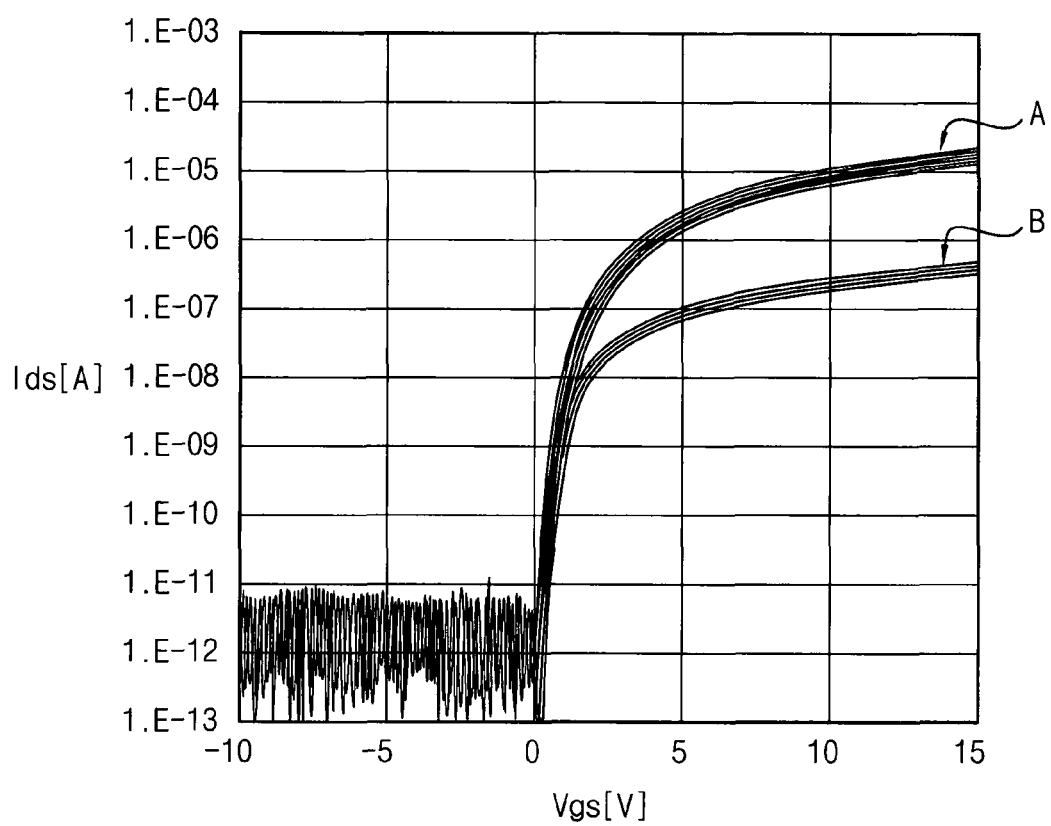
FIG. 19 is a graph illustrating a transfer characteristic of an oxide semiconductor device in accordance with example embodiments.

FIG. 19 is a graph illustrating a transfer characteristic of an oxide semiconductor device in accordance with example embodiments.

Referring to FIG. 19, the upper graph (A) (i.e., a transfer curve of a semiconductor device in accordance with example embodiments) shows a steeper slope compared with the lower graph (B) (i.e. a transfer curve of a conventional semiconductor device), and also shows an improved on-current characteristic. Accordingly, the oxide semiconductor device according to one exemplary embodiment can have an improved transfer characteristic. Additionally, the oxide semiconductor device can have a uniform transfer characteristic over the display panel.

When the oxide semiconductor device is employed in a display device such as a organic light emitting display device, a liquid crystal display device, a flexible display device, etc, the display device having the transistor can have various advantageous such as a reduced thickness, improved image resolutions, and an improved operating speed.

The foregoing is illustrative of example embodiments and is not to be constructed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing an oxide semiconductor device, the method comprising:
    forming a gate electrode on a substrate;
    forming a gate insulating layer on the gate electrode;
    forming an active pattern on the gate insulating layer;
    forming a first mask pattern on the gate insulating layer and the active pattern;
    forming an insulating interlayer on the gate insulating layer, the active pattern, and the first mask pattern;
    forming a second mask pattern on the insulating interlayer, the second mask pattern comprising an opening that exposes a region where the first mask pattern is formed;
    forming contact holes exposing portions of the active pattern by patterning the insulating interlayer using the first mask pattern and the second mask pattern;
    removing the first mask pattern and the second mask pattern after patterning the insulating interlayer using the first mask pattern and the second mask pattern; and
    forming a source electrode and a drain electrode on the active pattern by filling the contact holes, the drain electrode spaced apart from the source electrode.

2. The method of claim 1, wherein the first mask pattern comprises a thickness that is substantially the same as a thickness of the second mask pattern.

3. The method of claim 1, wherein the first mask pattern and the second mask pattern are formed using a single mask.

4. The method of claim 3, wherein the single mask comprises:
    a light-blocking portion corresponding to a region where the contact holes are not to be formed; and
    a light-transmitting portion corresponding to a region where at least one of the contact holes are to be formed.

5. The method of claim 1, wherein the first mask pattern is formed using a negative-type photoresist.

6. The method of claim 1, wherein the second mask pattern is formed using a positive-type photoresist.

7. The method of claim 1, wherein the gate electrode comprises at least one of a metal, an alloy, a metal nitride, and a transparent conductive material.

8. The method of claim 7, wherein the gate electrode comprises at least one of a first metal having conductivity, a second metal having heat resistance, and a metal compound having heat resistance.

9. The method of claim 1, wherein the source electrode and the drain electrode comprise at least one of a metal, an alloy, a metal nitride, a conductive metal oxide, and a transparent conductive material.

10. The method of claim 1, wherein the active pattern comprises a semiconductor oxide comprising at least one of a binary compound, a ternary compound, and a quaternary compound.

11. The method of claim 10, wherein the active pattern comprises the semiconductor oxide comprising at least one of indium (In), zinc (Zn), gallium (Ga), stannum (Sn), titanium (Ti), aluminum (Al), hafnium (Hf), zirconium (Zr), and magnesium (Mg).

12. The method of claim 10, wherein the active pattern comprises a composition of the semiconductor oxide and additionally at least one of lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), rubidium (Ru), germanium (Ge), stannum (Sn), and fluorine (F).

13. A method of manufacturing a display device, the method comprising:
    forming a gate electrode on a substrate;
    forming a gate insulating layer on the gate electrode;
    forming an active pattern on the gate insulating layer;
    forming a first mask pattern on the gate insulating layer and the active pattern;
    forming an insulating interlayer on the gate insulating layer, the active pattern, and the first mask pattern;
    forming a second mask pattern on the insulating interlayer, the second mask pattern comprising an opening that exposes a region where the first mask pattern is formed;
    forming contact holes exposing portions of the active pattern by patterning the insulating interlayer using the first mask pattern and the second mask pattern;
    removing the first mask pattern and the second mask pattern after patterning the insulating interlayer using the first mask pattern and the second mask pattern;
    forming a source electrode and a drain electrode on the active pattern by filling the contact holes, the drain electrode being spaced apart from the source electrode;
    forming a first electrode electrically connected to the drain electrode;
    forming a light emitting layer connected to the first electrode; and
    forming a second electrode connected to the light emitting layer.

14. The method of claim 13, wherein the first mask pattern comprises a thickness that is substantially the same as a thickness of the second mask pattern.

15. The method of claim 13, wherein the first mask pattern and the second mask pattern are formed using a single mask.

16. The method of claim 15, wherein the single mask comprises:
   a light-blocking portion corresponding to a region where the contact holes are not to be formed; and
   a light-transmitting portion corresponding to a region where the contact holes are to be formed.

17. The method of claim 13, wherein the first mask pattern is formed using a negative-type photoresist.

18. The method of claim 13, wherein the second mask pattern is formed using a positive-type photoresist.

* * * * *